United States Patent

Roozenbeek et al.

[11] Patent Number: 5,973,410
[45] Date of Patent: Oct. 26, 1999

[54] SAFETY DEVICE FOR LINKING REFERENCE GROUNDS IN AN INTEGRATED CIRCUIT

[75] Inventors: Herman Roozenbeek, Schwieberdingen; Achim Herzog, Backnang, both of Germany

[73] Assignee: Robert Bosch GmbH, Stuttgart, Germany

[21] Appl. No.: 09/092,288

[22] Filed: Jun. 5, 1998

[30] Foreign Application Priority Data

Jun. 6, 1997 [DE] Germany .......................... 197 23 928

[51] Int. Cl.⁶ ....................................... H02H 7/26
[52] U.S. Cl. ..................... 307/10.1; 307/100; 324/503; 337/15; 361/67
[58] Field of Search ..................... 307/9.1, 10.1, 307/100; 361/62, 67, 70, 54; 324/500, 503; 701/29, 33, 34; 337/15; 340/650

[56] References Cited

U.S. PATENT DOCUMENTS

| Re. 34,643 | 6/1994 | Payne | 361/62 |
|---|---|---|---|
| 3,909,677 | 9/1975 | McClain | 317/67 |
| 5,329,237 | 7/1994 | Horch | 361/67 |
| 5,559,661 | 9/1996 | Meinders | 361/54 |

FOREIGN PATENT DOCUMENTS

| 2 379 155 | 8/1978 | France . |
|---|---|---|
| 87 15 073 U | 4/1988 | Germany . |

*Primary Examiner*—Albert W. Paladini
*Attorney, Agent, or Firm*—Michael J. Striker

[57] ABSTRACT

The safety device, especially in an electronic motor vehicle control system, protects external circuit branches supplied with current from an engine/motor vehicle control unit so that a single short circuit results in failure of only that circuit branch in which the short circuit is located, so that an emergency operation of the electronic motor vehicle control system is possible. The respective reference grounds of the external circuit branches are connected to a common ground conductor (11) via an interface (3) including respective reference ground connectors (d, k, m). Each reference ground connector includes a safety device in the form of thin wire plug bonds, whose maximum current load sets the maximum current load of the respective external circuit branches. Then, if there is a short circuit to the reference ground of the concerned external circuit branch to a main supply voltage, the remaining circuit branches remain unaffected and operational.

10 Claims, 1 Drawing Sheet

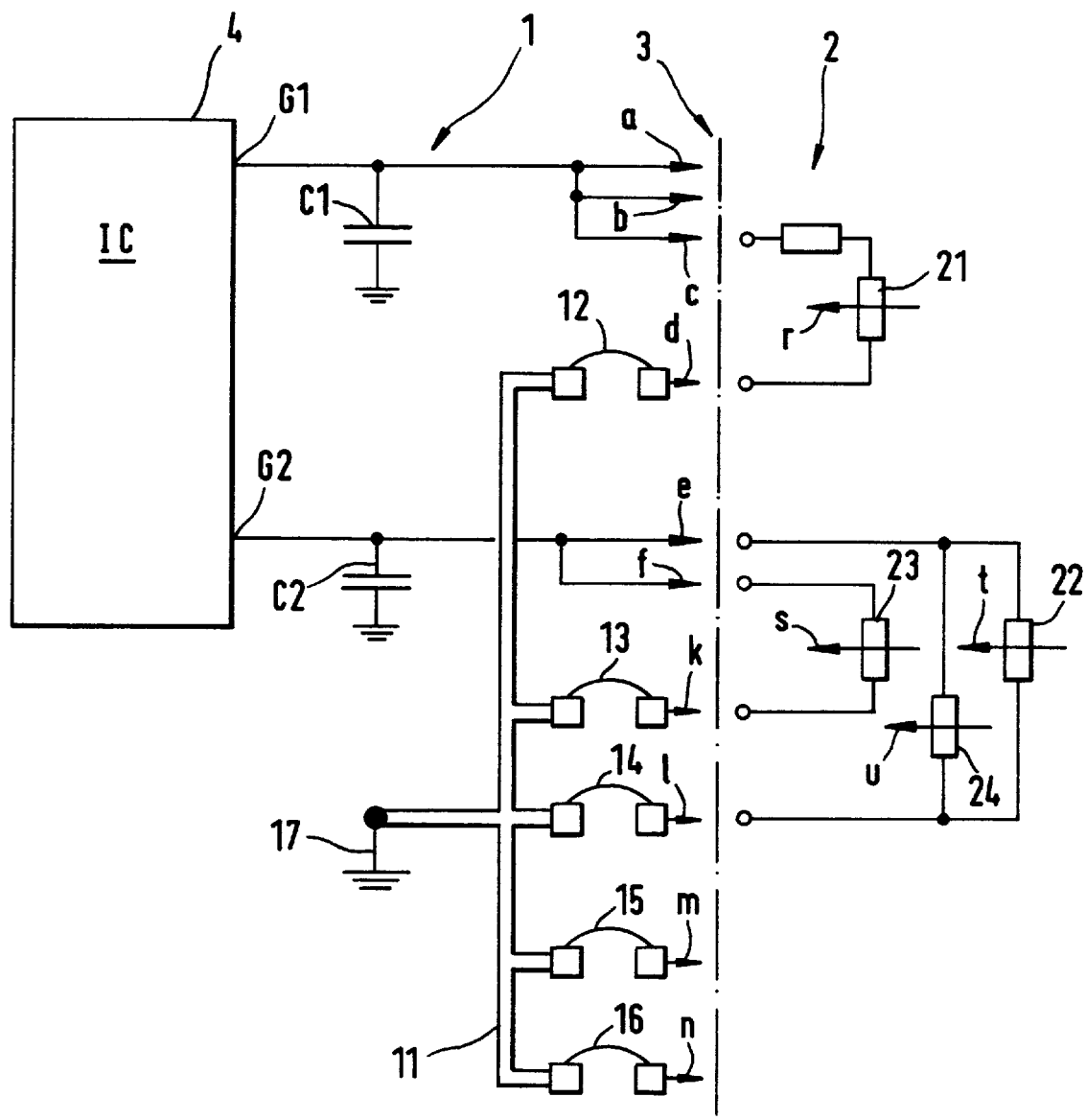

SAFETY DEVICE FOR LINKING REFERENCE GROUNDS IN AN INTEGRATED CIRCUIT

BACKGROUND OF THE INVENTION

The present invention relates to a safety device for linking reference grounds and analog reference voltages in integrated circuits, especially in electronic motor vehicle control systems, with an interface for connection of external circuit branches, e.g. adjusting and sensor systems, with a power supply network conducting a supply voltage derived from a main voltage and a common ground conductor. It also relates to an improved electronic motor vehicle control system including this safety device.

The control system in its entirety must not fail in the event of short circuits, especially at the battery voltage, particularly because of safety reasons, in connections of sensors and actuators with an electronic system in a motor vehicle. This is especially true for connection of reference grounds in hybrid circuits, micro-hybrid circuits or circuits of other substrate technologies. Failure of the entire ground branch of the reference grounds because of a short circuit to the battery voltage can occur in the known motor vehicle control systems.

SUMMARY OF THE INVENTION

It is an object of the present invention to provide a safety device for linking reference grounds in integrated circuits in hybrid, micro-hybrid or other substrate technologies of the above-described kind, which prevents a failure of the entire system during a short circuit of an individual reference ground to the main voltage (especially the motor vehicle battery voltage).

It is another object of the present invention to provide an improved electronic motor vehicle control system including this improved safety device.

These objects, and others which will be made more apparent hereinafter, are attained in a safety device for linking reference grounds of respective external circuit branches to a common ground, especially in an electronic motor vehicle control system, with an interface for connection of external circuit branches, such as adjusting systems and/or sensor systems, respectively with a power supply network providing a supply voltage derived from a main voltage and a common ground conductor.

According to the invention, the interface has respective separate ground connectors for references connection of the reference grounds to the common ground conductor for the respective external circuit branches and each references ground connector of the interface has a safety device which comprises means for preventing failure of any other circuit branch besides the circuit branch having the safety device by reaction of the safety device when a short circuit of its reference ground to the main voltage occurs in that circuit branch.

The apparatus according to the invention is designed so that an individual short circuit to the main voltage only leads to a failure of the concerned external circuit branch and thus an emergency operation of the integrated circuit, especially of the motor vehicle control system, is possible, since the safety device in the circuit in which this short circuit occurs responds.

The safety device is preferably a thin wire plug bond in each of the ground connectors of hybrid circuits.

Alternatively in other substrate technologies a conductor strip narrowed portion in each of the ground connectors can operate as the safety device.

The wire cross-section of the thin wire plug bond or bonds and/or the cross-section of the conductor strip narrowed portion or portions is designed according to the current load on the concerned circuit branch.

The invention also concerns an improved digital electronic motor vehicle control system including an integrated circuit acting as control unit and an interface with respective ground connectors including safety devices for connection of at least one sensor ground for sensors on the vehicle side, at least one sensor ground for a set value controlling device, at least one sensor ground for sensors on the engine side and at least one reference ground of one or more $\lambda$-probes with the common ground conductor.

So that in a preferred embodiment each separate circuit branch and/or its ground connection has the same current load, the wire cross-section of the thin wire plug bond or the cross-section of the conductor strip narrowed portion is designed for the same current load.

BRIEF DESCRIPTION OF THE DRAWING

The objects, features and advantages of the invention will now be illustrated in more detail with the aid of the following description of the preferred embodiments, with reference to the accompanying drawing FIGURE in which the Sole FIGURE is a schematic circuit diagram of one example of a safety device for combining reference grounds in an integrated circuit of an electronic motor vehicle control system.

DESCRIPTION OF THE PREFERRED EMBODIMENTS

The device shown in the sole FIGURE can cooperate for example with a digital circuit (IC) 4 acting as digital engine/motor vehicle control unit, for example a control unit such as is made and sold under the Trademark "MOTRONIC" with the part number CJ910 of Robert Bosch GmbH. In the FIGURE the left side of the interface 3 connecting to the IC 4 is shown with the reference number 1 and the right side, namely the sensor side, is indicated with reference number 2. The integrated circuit IC 4 has two power supply voltage outputs O1 and O2, which feed respective separate current supply networks G1 and G2. A smoothing condenser C1 is connected to ground in current supply network G1 and another smoothing capacitor C2 is connected to ground in the other current supply network G2. The current supply network G1 is connected to three connectors a, b, and c in the interface 3. The connector a provides the current flow to the sensors of the motor side, the connector b provides the power for the sensors on the vehicle side and the connector c provides the power for a set value potentiometer 21 on the vehicle side. The set value signal is transmitted by means of a signal line indicated by an arrow r.

The current supply network G2 is connected to two other connectors e and f in the interface 3. The connector e makes a connection to the sensors 22,24 on the engine side, while the connector f makes a connection to a set value potentiometer 23. The potentiometer signals and/or the sensor signals input to the digital engine/motor vehicle control unit 4 are indicated by the arrows s, t and u.

The side 1 left of the interface 3 has a common ground conductor 11, that is connected to a network ground 17. Ground conductor branches lead from the common ground conductor 11 to the respective individual ground connectors d, k, l, m and n in the interface 3.

The ground connector d makes the ground connection to the sensor ground of the set value potentiometer indicated with 21 on the vehicle side. The ground connector k makes the ground connection to the sensor ground of the set value potentiometer indicated with the number 23. The ground connector l makes the ground connection to the sensors 22 and 24 on the motor side. The ground connectors m and n make separate ground connections to the other reference grounds, for example, of λ-probes.

The above-mentioned ground connectors d, k, l, m and n of the interface 3 have respective safety devices in the form of thin wire plug bonds 12 to 16 which provide that an individual short circuit to one of the respective reference grounds only leads to failure of the concerned circuit branch, since the thin wire of the respective plug bond is melted through. Although it is not shown, each thin wire plug bond alternatively can be replaced by a conductor strip narrowed portion. The thin wire plug bonds are especially suitable for hybrid circuits. In other substrate technologies the conductor strip narrowed portions are particularly advantageous as safety devices. The wire cross-section of thin wire plug bonds and/or the constriction of the narrowed portion of the conductor strip is designed according to the current load on the concerned circuit branch.

For example, a current flow of 3.5 A flows through each thin wire plug bond in a motor vehicle control system which thus represents the responding threshold for each safety device. A current above 3.5 A melts the thin wire of the respective thin wire plug bonds. In this way an individual short circuit only leads to a failure of the concerned circuit branch.

An emergency operation of the motor/motor vehicle control unit is possible because of that in spite of failure of one circuit branch.

Understandably the device according to the invention described above can also be used in other systems besides electronic motor vehicle systems, e.g. in process control, measurement and control systems and other systems in which reference grounds are used in control circuits. Instead of the safety devices melted through by a flow of excess current preferably used here, which are based on the above-described thin wire plug bond and the narrowed portion of the conductor strip in the ground connectors, also other active safety device can be used which detect the flow of current by sensors and disconnect the connections in the ground connectors until the short circuit is eliminated.

The disclosure of German Patent Application 197 23 928.5 of Jun. 6, 1997 is hereby explicitly incorporated by reference. This German Patent Application discloses the same invention as described herein and claimed in the claims appended hereinbelow and is the basis for a claim of priority for the instant invention under 35 U.S.C. 119.

While the invention has been illustrated and described as embodied in a device for linking reference grounds in integrated circuits, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

We claim:

1. A device for connecting a plurality of reference grounds of respective external circuit branches to a common ground (17), said device comprising a common ground conductor (11) connected to said common ground (17); and an interface (3) for connecting said external circuit branches with current supply networks (G1,G2), wherein said current supply networks (G1,G2) are supplied with respective supply voltages derived from a main voltage via an integrated circuit (IC) and said interface (3) includes respective reference ground connectors (d,k,l,m,n) connecting said reference grounds of said external circuit branches with said common ground conductor (11);

wherein each of said reference ground connectors (d,k,l,m,n) of said interface (3) includes a safety device (12 to 16) and each of said safety devices (12 to 16) includes means for preventing failure of any other external circuit branch besides the external circuit branch including said safety device when a short circuit of the reference ground in said external circuit branch to the main voltage occurs.

2. The device as defined in claim 1, wherein said integrated circuit (IC) is at least a part of an electronic motor vehicle control system of a motor vehicle and said external circuit branches include adjusting means and/or sensor means for the motor vehicle.

3. The device as defined in claim 1, wherein the safety device in each of the reference ground connectors is a narrowed portion of a conductor strip.

4. The device as defined in claim 1, wherein said safety device in each of said reference ground connectors is a thin wire plug bond.

5. The device as defined in claim 4, wherein the thin wire plug bond has a cross-section designed according to a current load in said external circuit branch to which the thin wire plug bond is connected.

6. An electronic motor vehicle control system comprising a plurality of current supply networks (G1,G2) for supplying current to a plurality of external circuit branches, said external circuit branches including respective reference grounds, and comprising vehicle sensor circuit branches and set value adjusting device circuit branches;

an integrated circuit (IC) comprising a digital engine/motor vehicle control unit and including means for supplying the current supply networks (G1,G2) with respective supply voltages derived from a main voltage;

a common ground conductor (11) connected to a common ground (17); and an interface (3) for connecting said external circuit branches to said current supply networks (G1,G2) in order to supply said current to said external circuit branches and including respective reference ground connectors (d, k, l, m, n) separately connecting said reference grounds of the respective external circuit branches to the common ground conductor (11), each of said reference ground connectors of the interface (3) includes a safety device (12 to 16) and each of said safety devices comprises means for preventing failure of any other external circuit branch besides said external circuit branch including said safety device when a short circuit of said reference ground to said main voltage occurs.

7. The electronic motor vehicle control system as defined in claim 6, wherein the safety device in each of the ground connectors is a thin wire plug bond or a conductor strip narrowed portion and said safety device has a cross-section designed according to a current load in said external circuit branch connected with the safety device.

8. The electronic motor vehicle control system as defined in claim 6, wherein the main voltage is a battery voltage of a battery in the motor vehicle.

9. The electronic motor vehicle control system as defined in claim 6, wherein each of said safety devices (12 to 16) permits a maximum current load of 3.5 A in said external circuit branch associated therewith.

10. The electronic motor vehicle control system as defined in claim 6, wherein said external circuit branches include electrical signal generators and/or sensors which are combined in groups according to current flow and each group is supplied with the supply current from said current supply networks (G1,G2) of the integrated circuit (4).

* * * * *